United States Patent [19]

Shuskus et al.

[11] 4,421,592
[45] Dec. 20, 1983

[54] PLASMA ENHANCED DEPOSITION OF SEMICONDUCTORS

[75] Inventors: Alexander J. Shuskus, West Hartford, Conn.; Melvyn E. Cowher, East Brookfield, Mass.

[73] Assignee: United Technologies Corporation, Hartford, Conn.

[21] Appl. No.: 266,545

[22] Filed: May 22, 1981

[51] Int. Cl.³ .......................................... C30B 25/10
[52] U.S. Cl. ................... 156/613; 136/261; 136/262; 427/39
[58] Field of Search .............. 156/601, 613, DIG. 88, 156/DIG. 71, DIG. 73; 148/175; 427/39, 81

[56] References Cited

U.S. PATENT DOCUMENTS

| | | | |
|---|---|---|---|
| 3,047,438 | 7/1962 | Marinace | 148/1.5 |
| 3,158,511 | 11/1964 | Robillard | 156/601 |
| 3,186,880 | 6/1965 | Skaggs et al. | 148/1.6 |
| 3,200,018 | 8/1965 | Grossman | 148/175 |
| 3,490,961 | 1/1970 | Frieser et al. | 148/175 |
| 3,600,218 | 8/1971 | Pennebaker | 117/93.1 |
| 3,661,637 | 5/1972 | Sirtl | 427/55 |
| 3,969,163 | 7/1976 | Wakefield | 156/613 |
| 3,993,533 | 11/1976 | Milnes et al. | 156/613 |
| 4,066,037 | 1/1978 | Jacob | 118/49.1 |
| 4,116,751 | 9/1978 | Zaromb | 156/600 |
| 4,171,235 | 10/1979 | Fraas et al. | 148/175 |
| 4,223,048 | 9/1980 | Engle, Jr. | 427/39 |
| 4,232,057 | 11/1980 | Ray et al. | 427/39 |
| 4,255,208 | 3/1981 | Deutscher et al. | 148/175 |
| 4,262,631 | 4/1981 | Kubacki | 118/723 |
| 4,263,087 | 4/1981 | Tanabe et al. | 156/613 |
| 4,268,711 | 5/1981 | Gurev | 136/256 |

OTHER PUBLICATIONS

New Encyclopedia Britannica Macropaedia V15 1974 Benton-Pub. pp. 448-452.
"Plasma-promoted deposition of thin inorganic films" by Myron J. Rand, J. Vac. Sci. Technol., 16(2), Mar.-/Apr., 1979, pp. 420-427.
"The Effects of an Electric Field on Epitaxial Vapor Growth" by Y. Tarui et al., Journal of the Electrochemical Society, vol. 110, No. 11, Nov. 1963, pp.1167-1169.

Primary Examiner—Hiram H. Bernstein
Attorney, Agent, or Firm—Charles E. Sohl

[57] ABSTRACT

Semiconductor thin films are produced using plasma assisted chemical vapor deposition on alkali halide single crystal substrates. Deposition is formed at relatively low temperatures so that sublimation of the substrate is not a problem. The invention process permits at high rate deposition of high quality semiconductors.

4 Claims, 1 Drawing Figure

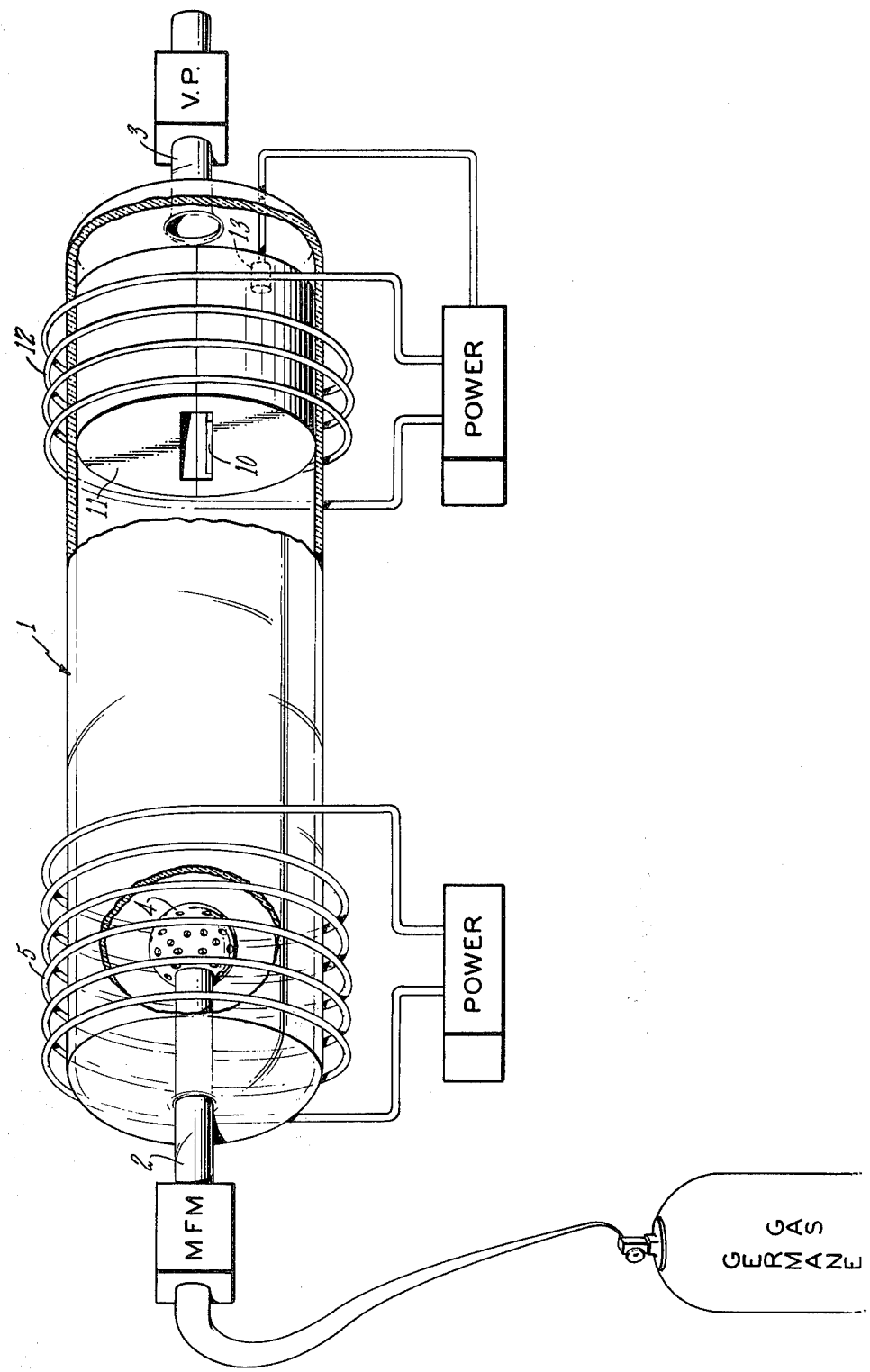

PLASMA ENHANCED DEPOSITION OF SEMICONDUCTORS

DESCRIPTION

TECHNICAL FIELD

This invention relates to the production of thin film semiconductors.

BACKGROUND ART

For many semiconductor applications there is a need to produce large single crystal films of high purity. Typical of these application are solar cells. In other applications even where small semiconductor devices are contemplated, economics dictate that the starting film size be as large as possible.

In the past thin semiconductor films were produced from bulk single crystals of the desired semiconductor by mechanically cutting the crystal into layers. Apart from the question of economics, such methods are technically undesirable because of the likelihood of producng significant amounts of contamination and mechanical defects into the layers. Thus, the semiconductor field has made use of various techniques for depositing thin semiconductor layers on substrates and removing such layers from the substrate by different techniques. This invention comprises a method and apparatus for depositing thin layers of semiconductor materials such as germanium and gallium arsenide on inexpensive disposable sodium chloride substrates. In contrast to the prior art, the invention provides for high rates of deposition without contamination of the semiconductor material by the substrate material.

There are two methods which have general utility in the production of thin semiconductor films. In the physical vapor deposition (PVD) process the starting material is the same material as the desired coating and deposition occurs without chemical reaction, for example by evaporation or sputtering. PVD deposition of semiconductors is described in U.S. Pat. Nos. 3,158,511, 3,186,880 and 4,255,208. All of these patents mention the use of sodium chloride as a substrate. The other major process is chemical vapor deposition (CVD). In the chemical vapor deposition (CVD) process the starting material is a chemical compound having as one of its elements the desired coating material. The other elements in the compound are usually materials which are gaseous under the deposition conditions employed. This starting material, which is usually a gas is decomposed (usually thermally decomposed) and the desired coating material condenses on the (heated) substrate. U.S. Pat. Nos. 3,661,637, 3,993,533 and 4,171,235 all describe the CVD deposition of semiconductor materials. Inherent in the CVD process is the necessity to heat the substrate to a substantial temperature. The thermal energy provided in the substrate by heating serves two purposes, it serves to decompose the precursor gas and it also aids in the deposition process in the following fashion. The thermal energy increases the surface mobility of the semiconductor atoms after they strike the surface, thus increasing the likelihood that a semiconductor atom that strikes the substrate will come to rest in a "minimum potential well" so that epitaxial growth will occur. The necessity of heating the substrates reduces the processes flexibility in two respects. When certain otherwise suitable substrate materials are heated they sublime and redeposit on the substrate along with the semiconductor, thus contaminating the semiconductor. The necessity to heat the substrate to a substantial temperature also imposes the requirement that the substrate and semiconductor material have similar coefficients of thermal expansion. If the substrate and semiconductors have significantly different coefficients of thermal expansion, mechanical failure of the semiconductor film may occur when cooling to room temperature. In an apparent effort to overcome this thermal mechanical problem, certain patents suggest the use of a three layer technique in which a semiconductor substrate is coated with a thin layer of salt for which it has a sufficiently different coefficient thermal expansion and the semiconductor film is deposited on the intermediate layer. This is described in U.S. Pat. No. 4,116,751. Using this approach, the initial semiconductor substrate apparently provides substantial support and restraint so that mechanical failure of the thin film is not a problem.

DISCLOSURE OF INVENTION

This invention deals with the CVD preparation of semiconductor films on salt substrates using a plasma assisted deposition technique to reduce the substrate temperature required for deposition. By using the plasma technique the substrate temperature can be reduced so that contamination of the semiconductor by substrate sublimation is not a problem. The precursor gas passes through a plasma region and then over an alkali halide substrate. A removal technique is described which circumvents the problem of difference in coefficient thermal expansion between the substrate and semiconductor layer.

Other features and advantages will be apparent from the specification and claims and from the accompanying drawings which illustrate an embodiment of the invention.

BRIEF DESCRIPTION OF DRAWING

The FIGURE shows the apparatus which may be used for performing the invention.

BEST MODE FOR CARRYING OUT THE INVENTION

This invention concerns a method and apparatus for depositing thin single crystal semiconductor films on a salt substrate. Deposition occurs at relatively high rates. The films produced by the invention have a high degree of perfection and are substantially free from contamination. The semiconductors include the elemental semiconductors such as silicon and germanium and the compound semiconductors such as GaAs, InSb and similar compounds of elements in groups III and V of the periodic table. This invention relates to the production of thin semiconductor films by chemical vapor deposition (CVD) of the films. Such chemical vapor deposition is known in the art and is performed using a precursor gas which is decomposed to produce the semiconductor material desired on a substrate. The details of the precursor gas are not a part of the invention but are generally known in the prior art. The elemental semiconductors are generally produced using hydride precursor gases such as germane ($GeH_4$) and silane ($SiH_4$). The compound semiconductors can be deposited using organometallic precursors. In the case of GaAs for example, $(CH_3)_3Ga$ and $AsH_3$ are suitable while the case of InSb ($(C_2H_5)_3In$, and $(CH_3)_3Sb$) could be employed.

It is a surprising and unexpected result that the process and apparatus of the invention produce semiconductor deposition rates of as much as 20 μm per hour. This is about four times greater than the deposition rates produced by conventional CVD processes. It appears that the limits of the process and apparatus have not been reached and further improvements are anticipated.

A primary feature of the present invention is the use of alkali halide salt substrates in connection with the preparation of high quality thin films. While the prior art on occasion has attempted to use salt substrates, the prior art process conditions have not been suitable for the production of device quality semiconductor films. As used herein the term salt encompasses the alkali halides as typified by NaCl, KCl and LiF. Of course, not all of the alkali halides will be suited for all combinations of semiconductor and deposition techniques. Those skilled in the art can readily select the appropriate substrate using three criteria. First, the crystal structure and lattice parameter of the substrate must be appropriate. To our knowledge all of the alkali halides have a suitable crystal structure for deposition of the semiconductors of interest. The lattice parameter must be closely matched, preferrably to within at least 5% and most preferrably to within about 3% if reliable epitaxial growth is to be achieved. Most of the alkali halide salts can form mixed or alloy crystals thus permitting substantial control over the lattice parameter. For example, NaCl and KCl may be combined in any ratio to give a controllable lattice parameter from about 5.64 to about 6.28 Å. We have used NaCl in the <100> orientation to prepare single crystal germanium films but it is apparent that other substrate crystal orientations can also be used.

We now come to a key feature of the invention. In the prior semiconductor art the dissociation of the precursor gas which is a necessary part of the CVD process has been accomplished by thermal means. That is to say to achieve reliable deposition at useful rates it has been necessary to supply energy in the form of thermal energy by heating the substrate. This necessity of heating the substrate has in turn caused problems, when salt substrates were employed, because at the temperatures required most alkali halides have an unacceptably high vapor pressure which has led to the contamination of the deposited films.

It should also be observed that the substrate must have a certain minimum thermal energy in order that the semiconductor atoms will have adequate mobility, after they strike the surface, for epitaxial growth to occur. The surface temperature necessary to achieve epitaxial adherence of the semiconductor may be less than that required to dissociate the precursor gas. For example in the case of germanium, to dissociate germane requires a substrate temperature of 600°–700° C. However, a substrate temperature of only about 450° C. is required for the epitaxial capture of the impinging germanium atoms by the substrate surface. The differences in vapor pressure of a alkali halide such as NaCl at 650° C. and 450° C. is at least 3 orders of magnitude. Thus the invention process, which operates at this lower temperature, produces films which are substantially free of contamination.

The reduction in process temperature is accomplished by using a plasma technique as a substitute for most of the energy required to decompose a precursor gas and a small part of the energy required for epitaxial adherence of the semiconductor atoms.

The process is performed at a pressure of about 1 torr. This pressure has been found to give the best results, however useful results can be obtained in the range from about 0.1 torr to about 10 torr. This pressure is the total pressure in the reaction chamber which is filled with a diluted precursor gas. Typically the atmosphere consists of 5% of the precursor gas and 95% of the diluting gas. Several gases may be used for the diluting species. In the case of the hydride precursors, such as germane, we have found that a substantial increase in deposition rate can be obtained by using helium as a diluting gas rather than the more conventional hydrogen diluting gas.

The substrate must be maintained at an appropriate temperature. The temperature required is primarily determined by the semiconductor materials being deposited and is usually directly related to the melting point of the semiconductor. Thus the substrate temperature required for the deposition of Ge (M.P. 937° C.) is less than that required for the deposition of Si (M.P. 1412° C.).

An essential feature of the invention is the production of a plasma within the reaction chamber. The plasma is generated by using RF energy. It may be coupled either inductively or capacitively to the atmosphere. The plasma zone has two regions, the primary zone of greatest intensity located in close proximity to the RF source and a secondary zone of reduced intensity extending for some distance from the RF source. The secondary region is also termed the after glow. The salt substrate is generally located within the secondary zone, although it is quite possible that some circumstances would necessitate locating the substrate in the primary region. The precursor gas is introduced into the plasma zone and is caused to low through at least a portion of the primary zone and over the substrate. It will be appreciated that the plasma intensity (or energy), the velocity of the precursor gas and distance traveled by the precursor gas in the primary and secondary region prior to flowing over the substrate and the substrate are all interrelated and interact. We believe that those skilled in the art can readily practice the invention using this information and the information in the following illustrative example.

The invention will be better understood through reference to the following example which is intended to be illustrative rather than limiting. The deposition apparatus consists of a reaction chamber 1 within which the deposition process occurs. In the specific embodiment shown, the reaction chamber comprises a quartz tube with an internal diameter of about 50 mm and length of about 1 m. The tube is arranged to be gas tight except for inlet tube 2 and outlet tube 3 located at the ends of the tube. Access to the interior of the tube is provided through a slip joint which is not shown. A semiconductor precursor gas such as germane is caused to flow through the reaction chamber 1 under controlled conditions of flow rate and pressure by the combination of a mass flowmeter on the inlet tube 2 and a vacuum pump on outlet tube 3. The inlet tube 2 terminates within the reaction chamber 1 in a diffuser 4 consisting of a perforated sphere. The diffuser is not essential but has been found to provide substantial benefits. The diffuser is located within a induction coil 5, external of the reaction chamber, which is attached to an RF generator. In the specific apparatus used, the coil has six turns with an outer diameter of about 60 mm and the coil is about 75 mm long. The RF generator operates at a frequency of 13.65 mHz with a power output controlled to be about 100 watts. This power output is sufficient to produce a plasma zone within the reaction chamber 1 centered approximately about the diffuser 4. The primary plasma zone occurs within the reaction chamber in close proximity to the induction coil 5. A secondary plasma zone of reduced intensity extends within the reaction chamber at least as far as the substrate 10. The substrate 10 is made of sodium chloride and is located within a split graphite susceptor 11 which fits snugly within the reaction chamber 1 and is closely surrounded by induction heating coil 12 which is located external of the reaction chamber 1. The coil 12 is operated from a 400 khz cycle power supply. The power supply is controlled by feedback from a thermocouple (not shown) embedded within the susceptor and can be arranged to maintain the susceptor at a controlled temperature.

Using the apparatus described with a precursor gas consisting of 5 % germane diluted with helium, single crystal germanium could be produced on a single crystal sodium chloride substrate held at a temperature of about 450° C. at a rate of about 20 $\mu$m per hour. The precursor gas flows through the apparatus at a rate of about 160 cc per min and the interior of the reaction chamber is held at a pressure of about 1.0 torr.

As previously indicated, the use of a diffuser was found to produce significant results. Likewise, use of helium rather than hydrogen as a carrier gas provided a substantial improvement in deposition rate. While the apparatus described produces a pure semiconductor, those skilled in the art will appreciate that a dopant gas such as diborane can be introduced into the reaction chamber to produce P or N type doping. The placement of the substrate within a passage of reduced cross section area in the susceptor, as shown was found to substantially increase deposition rate, this appears to be related to the increase in gas velocity or turbulence resulting from the decrease in cross section area. It was found that the deposition rate was quite sensitive to the position of the substrate relative to the plasma zone. Best results were obtained when the substrate was located at the outer fringe of the secondary plasma zone, in the apparatus previously described, the substrate was about one inch from the plasma producing RF coil.

The apparatus shown in the FIGURE is a laboratory apparatus used to illustrate the invention and is not necessarily an apparatus suitable for a large scale production. Several alternatives are possible. Instead of the plasma generation by inductive coupling, the plasma might also be produced by compacitive coupling using parallel plates. In this case the substrate might be located between the plates. The use of an inductive heated susceptor arrangement is also amenable to various substitutions. For example, resistance heat could easily be used or a hot wall furnace arrangement could be employed. Both of these heating variants have been successfully employed in connection with the present invention.

The processes described in this application produces a thin semiconductor film on a alkali halide substrate. To make use of this semiconductor it is necessary to remove it from the substrate. While the specific removal techniques do not form a part of the present invention, it is appropriate to briefly describe from prior art techniques and to describe a technique which has been developed by the inventors and which they prefer. This preferred technique is the subject of patent application U.S. Ser. No. 266,544 titled Method for Removing Semiconductor Layers From Salt Substrates filed on May 22, 1981.

The prior art has suggested water dissolution of the substrate and sublimation of the substrate as removal techniques. The problem which is encountered in removing the substrate is that the substrate and semiconductor have different coefficients of thermal expansion and this can lead to the development of damaging stresses in the semiconductor upon cooling from the elevated deposition temperature to room temperature. The prior art has attempted to make use of this and has suggested that if the substrate is highly polished and free from pits and other defects that the stresses arising upon cooling will cause the semiconductor to shear away from the substrate. It is difficult to get reliable results with this technique.

The process employed by the inventors utilizes a substrate support (made of a material which is wettable by the molten substrate material) upon which the substrate and semiconductor rests. This assembly is heated to a temperature above the melting temperature of the substrate but below the melting temperature of the semiconductor and the melted substrate material is removed from the semiconductor by capillary attraction to the support.

Throughout this application the semiconductor deposition process has been described in terms of a single precursor gas, such as germane to produce germanium. It is of course appreciated that multiple gases can be employed to produce compound and/or doped semiconductors. For example to produce gallium arsenide, tri-methyl gallium can be used in conjunction with arsine. These gases could be mixed prior to entering the plasma zone or they can be introduced separately in the plasma zone through multiple diffusers. Those skilled in the art will appreciate that this latter possibility affords a great degree of flexibility. For example in the case of tri-methyl gallium, it is necessary to dissociate gallium from the methyl component but it is nexessary that the methyl component not be dissociated, otherwise the semiconductor material will be contaminated with carbon. By introducing the gases separately, at different points, within the plasma zone the dissociation process may be closely controlled. In a similar fashion it is apparent that various dopant materials may be introduced into the reaction chamber. It is also apparent that these dopant gases may be varied with time to produce a layered structure in which the dopant level varies through the thickness. Finally, we have successfully produced layered semiconductor materials by changing the precursor gases during the deposition process. For example using a sodium chloride substrate, we first deposited a layer of germanium and then a layer of gallium arsenide.

It should be understood that the invention is not limited to the particular embodiments shown and described herein, but that various changes and modifications may be made without departing from the spirit and scope of this novel concept as defined by the following claims.

We claim:

1. A method for depositing large single crystal semiconductor thin films on alkali halide substrates which comprises:
    a. providing a reaction and chamber means associated therewith for maintaining said chamber at a controllable low pressure;
    b. providing means for generating a plasma within at least a portion of the reaction chamber, said plasma zone having a primary zone and a secondary zone;

c. providing a single crystal alkali halide substrate within the reaction chamber within the plasma zone, said substrate closely matching the semiconductor material to be applied in crystal structure and lattice parameter but having a melting point which is less than the melting point of the semiconductor to be applied, said substrate having associated means for maintaining said substrate at a controllable elevated temperature;

d. maintaining the substrate at an elevated temperature and introducing at least one semiconductor precursor gas into the reaction chamber and causing at least a substantial part of the at least one gas to flow through the plasma zone and over the substrate, and then removing said at least one precursor gas from the reaction chamber; while maintaining the reaction chamber at a pressure of from 0.1 to 10 torr;

whereby the semiconductor precursor gas will be largely decomposed in the plasma zone and the semiconductor will be deposited epitaxially on the alkali halide substrate while the substrate is held at a lower temperature than would be required if thermal decomposition was employed to decompose the precursor gas, thereby minimizing contamination of the deposited semiconductor by the substrate material.

2. A method as in claim 1 in which the substrate is located in a region of reduced cross section relative to the plasma zone cross section so that turbulence and increased gas velocity occur in the vicinity of the substrate.

3. A method as in claim 2 in which the substrate is located within the secondary plasma zone.

4. A method as in claim 2 in which at least one of the precursor gases is a hydride gas and is diluted with helium.

* * * * *